United States Patent

Camps et al.

[11] Patent Number: 4,661,181
[45] Date of Patent: Apr. 28, 1987

[54] METHOD OF ASSEMBLY OF AT LEAST TWO COMPONENTS OF CERAMIC MATERIAL EACH HAVING AT LEAST ONE FLAT SURFACE

[75] Inventors: Patrick Camps, St. Etienne; Pierre Roset, Les Ulis, both of France

[73] Assignee: Thomson-CSF, Paris, France

[21] Appl. No.: 736,843

[22] Filed: May 22, 1985

[30] Foreign Application Priority Data

May 25, 1984 [FR] France ............................ 84 08245

[51] Int. Cl.⁴ .................. B32B 18/00; B32B 31/26
[52] U.S. Cl. ............................... 156/89; 228/188;
228/193; 228/195; 228/196; 264/56; 264/58;
264/65; 264/66
[58] Field of Search ............... 156/89; 228/188, 193,
228/195, 196, 115, 116, 197, 228, 234, 238, 121;
264/56, 58, 65, 66

[56] References Cited

U.S. PATENT DOCUMENTS

| 3,589,000 | 6/1971 | Galli | 228/188 |
| 3,789,499 | 2/1974 | Peguignet | 228/193 |
| 4,406,722 | 9/1983 | Chow et al. | 156/89 |

FOREIGN PATENT DOCUMENTS

| 0035438 | 2/1981 | European Pat. Off. | |
| 2839353 | 9/1978 | Fed. Rep. of Germany. | |
| 59-78790 | 5/1984 | Japan | 228/193 |
| 9166388 | 9/1984 | Japan | 228/193 |

OTHER PUBLICATIONS

"Chemical Abstracts", vol. 100, No. 2, Jan. 1984, p. 297, No. 11547t, Columbus, Ohio (USA).
"22nd Electronic Components Conference", 15–17, May 1972, pp. 416–426, Washington, DC (USA), R. W. Ilgenfritz et al.

Primary Examiner—Caleb Weston
Attorney, Agent, or Firm—Oblon, Fisher, Spivak, McClelland & Maier

[57] ABSTRACT

A method of assembly of at least two ceramic components each having at least one flat surface, as applicable in particular to microwave equipment and encapsulation modules for microwave semiconductors. The starting components are made of ceramic material which has been pre-fired, or in other words heated to about 1500° C., and are therefore rigid. The components are no longer joined together by means of a glass paste or a brazed joint between metallized parts but are heated to over 1700° C. The impurities which are present in the ceramic material in a proportion of 1 to 10% serve as a flux and produce an autogenous weld between the two components. Prior to assembly, the ceramic components can be provided with metallizations such as electric tracks on condition that these metallizations are refractory.

9 Claims, 6 Drawing Figures

U.S. Patent  Apr. 28, 1987  Sheet 1 of 2  4,661,181
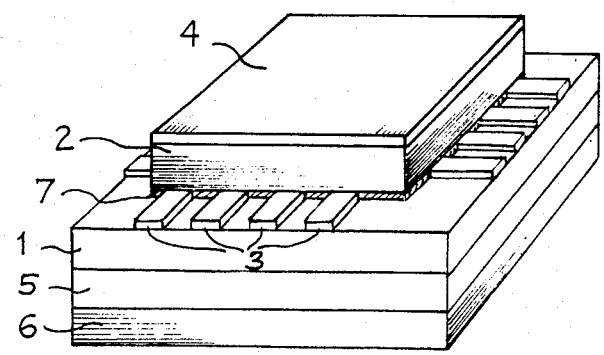
Fig.1
PRIOR ART
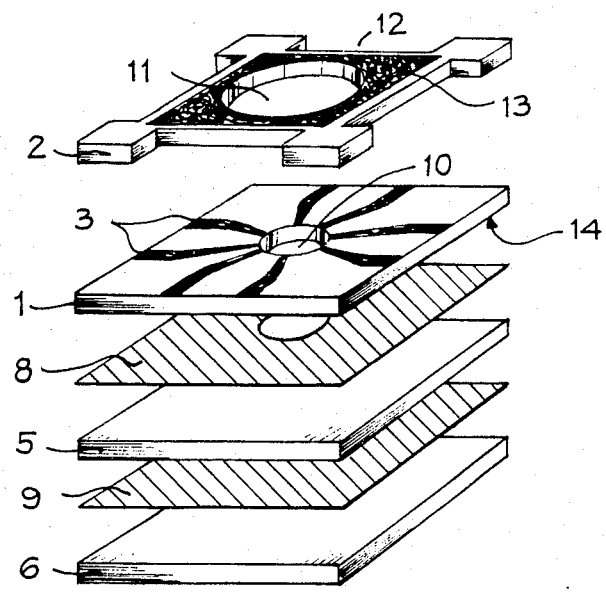
Fig.2
Fig.3
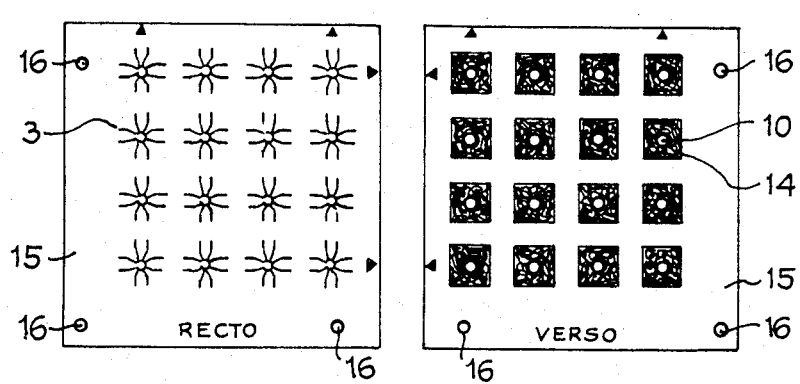
RECTO  VERSO

METHOD OF ASSEMBLY OF AT LEAST TWO COMPONENTS OF CERAMIC MATERIAL EACH HAVING AT LEAST ONE FLAT SURFACE

BACKGROUND OF THE INVENTION

1. Field of the Invention

The present invention relates to a method of assembly of at least two components of ceramic material each having at least one flat surface.

2. Description of the Prior Art

In accordance with this method, the components are permanently assembled together without interposition of cement, of glass or of any jointing material by autogenous welding performed during a heating operation at a temperature higher than or equal to 1700° C. in a reducing atmosphere.

The invention applies to the fabrication of products for the electronic industry in which it is necessary to provide a product having a predetermined thickness greater than or equal to 1 mm, for example, and electric conductors embedded within the thickness of the product. Two non-limitative examples of products within the field of application of the invention are multilayer substrates and so-called modules or encapsulating packages for semiconductor chips. The basic concept of a multilayer substrate includes within its scope the concept of a network of conductive tracks placed between the ceramic layers. It should be mentioned in addition that the concept of an encapsulating package or module presupposes the existence of connections providing an external access to the chip which is encapsulated within the module and consequently also of metallic tracks which pass through the thickness of the ceramic body.

The fabrication of ceramic objects comprising only a single layer does not present any particular problem. It is in fact known to produce sheets having a thickness of only a fraction of a millimeter as well as objects having a thickness of several centimeters or tens of centimeters. This is only a question of sintering means. On the other hand, the fabrication of ceramic objects comprising at least two components provided with conductive tracks is more difficult from different points of view. From the dimensional viewpoint, it may prove useful to assemble two components because they have a different geometry, for example, but co-sintering of two components of ceramic material pre-fired at 400° C. or at 1000° C. produces dimensional irregularity as a result of the shrinkage phenomenon. From an electrical standpoint, the brazing of two components which have previously been metallized locally must be carried out with scrupulous care since it is necessary to guard against any short-circuits with the metallic tracks whereas glass bonding is not recommended in microwave technology by reason of the losses involved.

SUMMARY OF THE INVENTION

In accordance with the invention, at least one ceramic component out of two is provided with conductive metallic tracks, said ceramic components being assembled together so as to form a monolithic multilayer object by firing in a furnace in a reducing atmosphere at a temperature higher than or equal to 1750° C. so that fusion of the fluxes which are always present in ceramics having a degree of purity within the range of 90 to 99% results in autogenous welding of the components to each other.

In more precise terms, the invention relates to a method of assembly of at least two components of ceramic material each having at least one flat surface and such that at least one component is provided with a metallization on one flat surface, said method being distinguished by the fact that:

the components are of ceramic material which has previously been fired at a temperature higher than 1600° C., the components which are presented with a flat face applied against a flat face are assembled by ceramic-to-ceramic autogenous welding, autogenous welding is obtained by fusion of fluxes present in the ceramic material during a thermal cycle which exceeds a temperature of 1700° C. during at least ten minutes in a wet hydrogen reducing atmosphere.

BRIEF DESCRIPTION OF THE DRAWINGS

Other features of the invention will be more apparent upon consideration of the following description and accompanying drawings, wherein:

FIG. 1 is a view in third-angle projection showing a module for encapsulating a semiconductor chip in accordance with the prior art;

FIG. 2 is an exploded view of a module of the same design as that of the previous figure but fabricated by means of the method in accordance with the invention;

FIG. 3 shows metallizations on the front and reverse faces of a ceramic plate for the collective fabrication of module bases in accordance with FIG. 2;

DETAILED DESCRIPTION OF THE INVENTION

Figure 4:
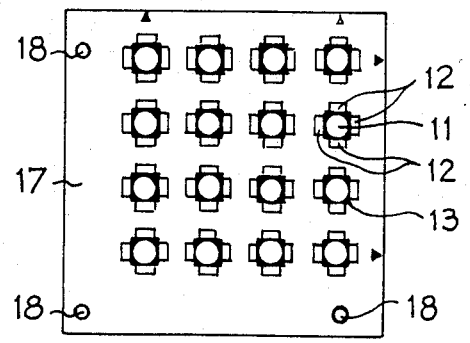
FIG. 4 shows metallizations and holes drilled in a plate for the collective fabrication of module frames in accordance with FIG. 2.

Although the invention is generally applicable to the assembly of a number of ceramic components each having at least one flat surface such as multilayer substrates comprising a plurality of metallic interconnections, consideration will be given in the following description to an encapsulation module which will serve to provide a clearer definition of the invention but which is given solely by way of example.

A package or module for the encapsulation of a semiconductor chip is illustrated in FIG. 1, this module being in accordance with patent application No. 82 113 99 filed by the present Applicant on June 29th 1982.

A module of this type as designed for semiconductors and microwave integrated circuits comprises a base plate 1 of ceramic material and a frame 2, also made of ceramic material. The base 1 is provided with a central hole having dimensions corresponding to those of the chip. The semiconductor chip is placed within the frame 2. External accesses to the chip are provided by metallic tracks 3 which pass between the base 1 and the frame 2. The module is hermetically sealed by a metal cover 4 which is brazed to the frame 2. In a module of this type, a very common practice consists in soldering the chip to a copper plate 5 brazed to the base 1 in order to dissipate heat. A plate 6 of molybdenum is in turn brazed to the copper plate 5 in order to balance and to compensate the different coefficients of expansion between the ceramic material of the base 1 and the copper of the radiation plate 5.

An encapsulation module of the type illustrated in FIG. 1 can be obtained in several ways. One method disclosed in patent No. 80 04208 in the name of the present Applicant consists in starting from a sheet of alumina pre-fired at temperatures varying between 400° C. and 1000° C., thus making the ceramic material still relatively soft, then in co-sintering the two components which have thus been pre-fired, namely the base 1 and the frame 2. While firing under pressure is taking place, the frame 2 undergoes deformation to a sufficient extent to take the exact shape of the surface elevations and depressions corresponding to the external leads 3 and the two components are co-fired, thus bonding them together. However, this method is limited on the one hand by the presence in the ceramic material of residues of plasticizers which have served to permit a transition from the state of a paste to a drawn sheet (in accordance with the so-called plastic ceramic technology) and on the other hand by the fact that there is no known method for forming plastic sheets of ceramic material having a thickness greater than about 1 mm. In consequence, if a certain depth is necessary for encapsulating a chip or any other semiconductor device, it proves impossible to obtain such a depth by reason of the geometrical limitation set by the thickness of the sheets of plastic ceramic material.

Another method which is illustrated in FIG. 1 consists in bonding the frame 2 to the base 1 by means of glass 7 which has been deposited on said base by the screen process. However, the presence of glass first of all involves an additional preparatory step which consists of screen-process deposition by means of suitable wire screens or masks and, in the second place, has the effect of inducing microwave frequency losses caused in particular by the presence of air micro-bubbles in the glass screen-process paste. There is at the present time no known method of eliminating these micro-bubbles.

The method in accordance with the invention makes it possible to produce a module of the type shown in FIG. 1 without being limited by the thickness of the module as a result of the thickness of the layers of plastic ceramic material and without being hindered in the microwave properties by the presence of a bonding layer of glass 7.

FIG. 2 is an exploded view of a module of the same design as that of the preceding figure but fabricated by the method in accordance with the invention.

This module is essentially constituted by a base plate 1 of ceramic material and by a frame 2, also of ceramic material. In addition, the base plate 1 is soldered to a copper dissipator 5 which is in turn soldered to a molybdenum plate 6, these two soldering operations being performed respectively by means of preforms 8 and 9 of soft solder. The module is closed by a cover which is not shown in this figure.

The base plate 1 is provided with a central opening 10 which serves to fix the semiconductor chip directly on the radiation plate 5. Around the opening 10 are deposited conductive tracks 3 corresponding in number to the external access connections which are necessary for the semiconductor chip. These tracks are deposited either by thin-film vacuum metallization or by screen-process deposition of a paste. By reason of the method of fabrication in accordance with the invention, the tracks are necessarily formed of refractory metals such as tungsten, molybdenum, manganese or the like. The conductive tracks have a thickness of the order of 9 to 10 microns.

The ceramic plate which forms the frame 2 is also provided with a central opening 11 which permits assembly by wire or microstrip between the semiconductor chip and the output leads 3. Provision is made at the periphery of said plate for one or a number of recesses 12 which will serve to establish connections with the external access tracks 3. Finally, a metallization 13 is formed on said plate in order to solder the cover which will close the module. In the same manner as the metallizations 3 of the base plate, said metallization 13 is formed either in a thin film or in a thick film.

On the side opposite to the face on which the metallizations 3 are deposited, the base plate 1 is provided with a metallization 14 for the purpose of providing a soldered connection with the metallic portions 5 and 6. By reason of the perspective view of FIG. 2, said metallization 14 is not visible in this figure.

FIG. 3 illustrates the front and rear portions of a ceramic plate for the collective fabrication of modules by means of the method in accordance with the invention. The front portion of the plate is located on the left-hand side of FIG. 3 and the rear or reverse portion is located on the right-hand side of this figure.

A ceramic plate 15 which has previously been sintered at a temperature above 1000° C., or in other words at a temperature within the range of 1400° C. to 1900° C. in accordance with techniques which are specifically applicable to ceramic materials, is provided with a series of holes which are preferably pierced by laser machining. A first series of holes 16 located in the corners of the plates serve as reference points for future operations. A second series of holes 10 correspond to the holes 10 of the base plates 1. An operation is then performed either by vacuum evaporation or by screen process in order to deposit on a first face the access metallizations 3 which are centered on a hole 10 and, on a second face, the soldered metallizations 14 which are centered on the same hole.

FIG. 4 illustrates the metallization deposits and holes pierced in another ceramic plate for the collective fabrication of frames of the module shown in FIG. 2. Provision is made for a first series of holes 18 formed in a second ceramic plate 17 which has been sintered in the same manner as the preceding to a temperature above 1000° C. or in other words within the range of 1400° C. to 1900° C. The positions of said holes 18 correspond strictly to the positions of the holes 16 in the first plate 15. There is then pierced a series of holes 11 corresponding to the holes 11 of the frame plate 2 and, if necessary, a series of rectangular holes 12 for providing access to the external leads 3 on the base plate 1 after cutting-out of the modules. Metallizations 13 are then deposited collectively around the holes 11 either by vacuum evaporation or by screen-process deposition.

The advantage of the two FIGS. 3 and 4 lies in the fact that they demonstrate the simplicity of the method of construction of a module in accordance with the invention since no operation involving deposition of glass, of an adhesive product or of a cement is necessary. Such operations are in fact very difficult since encapsulation modules for semiconductor chips or integrated circuits have dimensions of the order of 3 to 5 mm on a side. This accordingly involves deposition by means of extremely fine screens and therefore extremely delicate glass-deposition operations in the event that such operations are necessary.

When the two ceramic components have been prepared from an electrical standpoint or, in other words, when the necessary holes have been pierced and the metallization layers have been deposited, the method in accordance with the invention consists in placing these two components one above the other and in register by means of the holes 16 and 18 in which are inserted parts of molybdenum or tungsten, then in heating said components to a temperature higher than 1700° C. and preferably 1750° C. during a period of time at least equal to ten minutes.

By virtue of the basic concept of the method in accordance with the invention, the metallization layers formed on said ceramic substrates necessarily have a base of refractory metals which are employed either in the pure state by deposition or by co-deposition of alloy. These refractory metals mainly consist of tungsten, titanium, molybdenum, manganese. The metallized substrates are then assembled by means of the locating holes 16 and 18, then subjected to a thermal cycle at a temperature higher than 1700° C. and preferably 1750° C. in a wet hydrogen reducing atmosphere. The temperature of assembly of the components is in the vicinity of the temperature required for preliminary sintering of the substrates.

The components which are positioned with respect to each other are introduced into a high-temperature furnace and subjected to a thermal cycle which lasts about four hours. During the temperature rise in the vicinity of two hours, there is a level-temperature stage at 1420° C. in order to harden the metallization layers followed by a level stage of about ten minutes at the assembly temperature which is higher than 1750° C., followed by a temperature drop which also lasts about two hours.

The assembled components are not subjected to a pressure which would have the effect of thrusting them towards each other. Said components are simply subjected to gravity forces and the thickness of the metallization layers which is of the order of 9 to 10 microns in the case of screen-process deposition is not liable to prevent assembly of the plates against each other.

Figure 5:
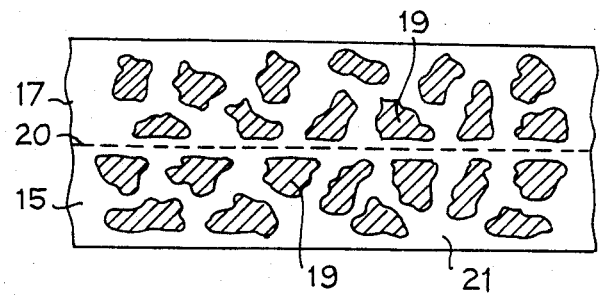
FIG. 5 shows the structure of an autogenous weld between ceramic plates as obtained by means of the method in accordance with the invention.

FIG. 5 is a sectional view as seen under a microscope and shows two plates such as the substrates 15 and 17 which are assembled together by mean of the method in accordance with the invention. It is observed in this sectional view that a very distinct boundary exists between the grains of alumina or of beryllium oxide located on each side of said boundary as represented schematically by a dashed line 20. This line corresponds to what had previously been the surface common to each of the two substrates 15 and 17. The alumina or beryllium oxide grains 19 never pass across said line. On the other hand, the fluxing products which are present in the ceramic material have been caused to melt during the firing process at a temperature above 1750° C. for the purpose of ensuring cohesion of the two substrates which subsequently form a monolithic component. These fluxing agents are represented in FIG. 5 as the ground-mass 21 in which the alumina or beryllium oxide granules 19 are embedded.

The type of alumina which is open to choice for the successful application of the invention extends over a relatively broad field since the purity of the alumina can vary within a range of 90% to more than 99%. The impurities which are present either in the natural state or added by the ceramist are essentially silicon, calcium or magnesium salts. Whether these salts were originally in the form of chloride, carbonate or sulfate is of little importance since they are converted to oxides after the different sintering operations.

The objects formed by the method in accordance with the invention are relatively fragile since they are formed in alumina substrates of small thickness. In consequence, when two substrates such as those designated by the references 15 and 17 are being heated from room temperature to a temperature above 1750° C., critical moments may be experienced either during the temperature rise or during the temperature drop. It has been observed that the assembly of two plates takes place with greater ease when said plates are virtually suspended in the surrounding atmosphere of the furnace but that, on the contrary, cracks appear essentially while cooling takes place if the plates are placed between two blocks of materials which may have the function of supports or which may serve to compress the plates. The appearance of cracks during cooling can be ascribed to the fact that the two blocks of materials which compress the plates against each other do not have the same coefficient of expansion and do not have the same cooling rate as the plates of ceramic material.

Figure 6:
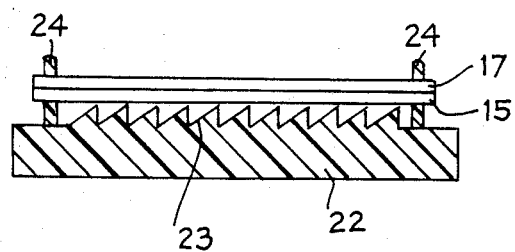
FIG. 6 shows a device for positioning plates to be assembled in accordance with the method of the invention.

In consequence, a device has been developed for positioning the plates to be assembled and is illustrated in FIG. 6. This device essentially comprises a block 22 of refractory material which affords resistance to heat at the temperature at which the two plates of ceramic material are bonded together in superposed relation. Said block 22 can be of molybdenum or of tungsten, or of other materials such as ceramics but has a melting point which is higher than the temperatures employed in the furnace for carrying out the bonding operations in accordance with the invention. The main surface of said block is machined so as to form sawteeth 23 which are subsequently ground in such a manner as to ensure that the crests of the teeth constitute a perfect plane. Provision is also made for a series of studs 24 of tungsten or of molybdenum. The positions of said studs 24 on the block must correspond strictly to the positions of the holes 16 and 18 in the ceramic plates 15 and 17.

The plates 15 and 17 or, more generally, the objects of ceramic material to be welded together are deposited on the refractory base 22 and supported by the tips of the sawteeth 23, with the result that the plates are only in partial contact with the base 22. Since the plates are positioned by means of the studs 24, the assembly is introduced in the furnace and the temperature rises from a standby value to a level-stage value of at least 1750° C. During the temperature rise, a level stage at 1420° C. is maintained during the period of time required to harden the metallization layers of tungsten, molybdenum, manganese and the like. The temperature is then reduced over a period of about two hours in order to return to a sufficiently low temperature to permit withdrawal of the base and the object which has been autogenously welded during this thermal cycle. The entire temperature cycle lasts about four hours.

The method in accordance with the invention offers a certain number of advantages. It permits the use of any standard commercially available ceramic substrate obtained by pressing or by casting, together with the possibility of employing ceramics of very high purity having low microwave frequency losses.

A further advantage is that this method is not limitative in regard to the thicknesses and the number of substrates or of components which can be assembled since autogenous welding takes place between at least two components of ceramic material which has already been fired at high temperature. There is no inherent phenomenon of shrinkage as is the case when molding from a raw ceramic material since the objects have already been fired prior to assembly and have therefore already been subjected to a shrinkage process. Furthermore, the fact of employing plates of fired ceramic material makes it possible, for example, to carry out laser cutting of said material prior to interassembly of a plurality of plates as in the case which has been chosen for the purpose of illustrating the invention. In fact, when making use of semi-fired ceramic plates, the laser cutting process is inefficient since the ceramic material is subject to chipping on the laser beam exit side of the plate, with the result that the components are not well cut. On the other hand, the objects fabricated by assembly between two plates of fired ceramic material can be cut with a diamond saw in addition to the laser-cutting operation.

Furthermore, the method in accordance with the invention is compatible with the thin-film technology on condition that the metallizations are formed with refractory metals. The method permits subsequent treatments such as surface metallization of substrates, edge metallization in accordance with thin-film or thick-film techniques.

Finally, the method in accordance with the invention is easy to apply in practice and does not call for special instruments apart from the instruments which are normally necessary for processing ceramic materials.

The invention has been described with reference to an example of fabrication of a micromodule but, as has already been stated, this example is intended only to illustrate the method in accordance with the invention for the sake of enhanced clarity. Generally speaking, the invention is adapted to a method of assembly of at least two ceramic components, each component being pre-fired and provided with at least one flat surface so as to permit assembly of the two components one above the other.

What is claimed is:

1. A method of assembling at least two ceramic components, each having at least one flat surface and each having been fired at a temperature greater than 1600° C., with at least one of said components being provided with metallization on one flat surface, comprising:
assembling said components in a flat face-to-face relationship; and
autogeneously welding said components by heating the assembled components in a thermal cycle which exceeds 1700° C. for at least ten minutes in a wet hydrogen reducing atmosphere, which heating results in fusion of the components by the fluxes present in the ceramic components.

2. The method of claim 1, wherein the purity of said ceramic components is within the range of 90-99%, with the impurities of said ceramic components being oxides of silicon, calcium and magnesium in which the silicon oxide forms a flux.

3. The method of claim 2, wherein said flux has a melting point of about 1710° C.

4. The method of claim 1, wherein said at least one metallization is of a base metal containing at least one refractory metal selected from the group consisting of tungsten, titanium, molybdenum, and manganese.

5. The method of claim 4, wherein said metallization is deposited by a thin-film technique.

6. The method of claim 4, wherein said metallization is deposited by a thick-film technique.

7. The method of claim 1, wherein the thermal cycling of said autogeneous welding step comprises (a) heating the components over a period of 2 hours, which period of time includes a level-temperature stage of 1420° C. in order to harden said metallization layers, (b) further heating the ceramic components to a temperature of at least 1700° C. for at least 10 minutes, and then (c) cooling the heated components for about 2 hours.

8. The method of claim 1, wherein, during said autogeneous welding, the temperature during said at least 10 minute period exceeds 1750° C.

9. The method of claim 1, wherein the thickness of said metallization layers is about 9-10 microns.

* * * * *